United States Patent
Ryu et al.

(10) Patent No.: US 10,012,708 B2
(45) Date of Patent: Jul. 3, 2018

(54) MAGNETIC RESONANCE IMAGING SYSTEM USING RADIO FREQUENCY (RF) COILS CORRESPONDING TO VOLUMES REPRESENTING TARGET REGIONS

(71) Applicant: Samsung Electronics Co., Ltd., Suwon-si (KR)

(72) Inventors: Yeun-chul Ryu, Hwaseong-si (KR); Young-beom Kim, Yongin-si (KR); Jae-Mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 659 days.

(21) Appl. No.: 14/171,172

(22) Filed: Feb. 3, 2014

(65) Prior Publication Data
US 2014/0218033 A1    Aug. 7, 2014

(30) Foreign Application Priority Data
Feb. 4, 2013    (KR) .................. 10-2013-0012605

(51) Int. Cl.
| G01R 33/34 | (2006.01) |
| G01R 33/345 | (2006.01) |
| G01R 33/3415 | (2006.01) |
| G01R 33/341 | (2006.01) |

(52) U.S. Cl.
CPC ..... *G01R 33/34046* (2013.01); *G01R 33/341* (2013.01); *G01R 33/3415* (2013.01); *G01R 33/34038* (2013.01); *G01R 33/3456* (2013.01)

(58) Field of Classification Search
CPC ........ G01R 33/34038; G01R 33/34046; G01R 33/341; G01R 33/3415; G01R 33/3456
See application file for complete search history.

(56) References Cited

U.S. PATENT DOCUMENTS

| 6,134,464 | A | 10/2000 | Tan et al. | |
| 6,366,092 | B1* | 4/2002 | Ehnholm | G01R 33/4835 324/300 |
| 7,952,356 | B2 | 5/2011 | Koch et al. | |
| 2007/0108980 | A1* | 5/2007 | Adriany | G01R 33/34046 324/318 |
| 2007/0210793 | A1* | 9/2007 | Kiefer | G01R 33/3664 324/307 |
| 2008/0284435 | A1* | 11/2008 | Overweg | G01R 33/341 324/318 |

(Continued)

FOREIGN PATENT DOCUMENTS

| KR | 10-0368890 B1 | 1/2003 |
| KR | 10-0900862 B1 | 6/2009 |

(Continued)

*Primary Examiner* — David M Gray
*Assistant Examiner* — Laura Roth
(74) *Attorney, Agent, or Firm* — NSIP Law

(57) ABSTRACT

A magnetic resonance imaging (MRI) system includes a main magnet configured to generate a static magnetic field, a gradient coil configured to generate a gradient magnetic field, and a radio frequency (RF) coil arrangement including RF components corresponding to volumes representing target regions of a subject, each of the volumes including slices, each RF components including sets of RF coil elements, and each set of RE coil elements being configured to apply RF fields to a slice of the corresponding volume.

16 Claims, 3 Drawing Sheets

(56) References Cited

U.S. PATENT DOCUMENTS

| | | | |
|---|---|---|---|
| 2010/0256477 A1* | 10/2010 | Harvey | G01R 33/3415 600/410 |
| 2011/0241683 A1 | 10/2011 | Nnewihe et al. | |
| 2012/0229141 A1* | 9/2012 | Brown | G01R 33/422 324/322 |
| 2012/0306494 A1* | 12/2012 | Yang | G01R 33/4808 324/318 |
| 2013/0342200 A1* | 12/2013 | Ugurbil | G01R 33/543 324/307 |
| 2014/0111201 A1* | 4/2014 | Kim | G01R 33/543 324/309 |
| 2014/0203805 A1 | 7/2014 | Kim et al. | |

FOREIGN PATENT DOCUMENTS

| | | |
|---|---|---|
| KR | 10-1113547 B1 | 2/2012 |
| KR | 10-2014-0094174 A | 7/2014 |

\* cited by examiner

MAGNETIC RESONANCE IMAGING SYSTEM USING RADIO FREQUENCY (RF) COILS CORRESPONDING TO VOLUMES REPRESENTING TARGET REGIONS

CROSS-REFERENCE TO RELATED APPLICATIONS

This application claims the benefit of Korean Patent Application No. 10-2013-0012605 filed on Feb. 4, 2013, in the Korean Intellectual Property Office, the entire disclosure of which is incorporated herein by reference for all purposes.

BACKGROUND

1. Field

This application relates to magnetic resonance imaging systems.

2. Description of Related Art

Various diagnostic devices for diagnosing health problems of patients are used to prevent or treat a disease. A magnetic resonance imaging (MRI) system that uses a magnetic field is one type of diagnostic device that has been widely used.

The MRI system includes elements that apply a radio frequency (RF) signal to a living tissue to make it resonate, and apply gradient signals to the living tissue to obtain spatial information thereof. Thus, it is possible to obtain internal images of organs in the human body using the MRI system, making it possible to differentiate between normal cells or tissues and abnormal cells or tissues.

SUMMARY

In one general aspect, a magnetic resonance imaging (MRI) system includes a main magnet configured to generate a static magnet field; a gradient coil configured to generate a gradient magnetic field; and a radio frequency (RF) coil including a plurality of RF coils corresponding to volumes representing target regions of a subject.

A number of the plurality of RF coils may be less than or equal to a number of the volumes representing the target regions of the subject.

Each of the plurality of RF coils may include a plurality of RF coil elements.

Each of the plurality of RF coil elements may be a loop-type RF coil element.

Each of the plurality of RF coils may further include an insulating substrate on which the plurality of loop-type RF coil elements are disposed.

Each of the plurality of RF coils may further include an RF shield disposed between the plurality of loop-type RF coil elements.

Each of the plurality of RF coil elements may be a strip-type RF coil element.

Each of the plurality of RF coils may further include an insulating substrate on which the plurality of strip-type RF coil elements are disposed.

Each of the plurality of RF coils may further include an RF shield disposed between the plurality of strip-type RF coil elements.

Each of the volumes may include a plurality of slices; and the plurality of RF coil elements of at least one of the plurality of RF coils may include a plurality of sets of RF coil elements configured to apply RF fields to the plurality of slices of at least one of the volumes corresponding to the at least one of the plurality of RF coils to excite the plurality of slices of the at least one of the volumes.

The plurality of RF coil elements may include both RF transmission coil elements and RF reception coil elements, or transmission/reception RF coil elements.

The gradient coil may be disposed in the main magnet; and the RF coil may be disposed in the gradient coil.

The plurality of RF coils may be disposed in a direction in which the main magnet is configured to generate the static magnetic field.

In another general aspect, a radio-frequency (RF) coil for a magnetic resonance imaging (MRI) is configured to simultaneously excite at least two of a plurality of volumes representing target regions of a subject to be imaged by the MRI system, and simultaneously excite each of a plurality of slices of each of the at least two simultaneously excited volumes.

The RF coil may include a plurality of RF coils each corresponding to at least one of the volumes.

Each of the plurality of RF coils may correspond to one of the volumes, and may be configured to excite a corresponding one of the volumes.

The plurality of RF coils may be disposed in a direction in which the MRI system is configured to generate a static magnetic field.

Each of the plurality of RF coils may include a plurality of RF coil elements.

Each of the RF coils may be a loop-type RF coil element or a strip-type RF coil element.

The plurality of RF coil elements of each of the plurality of RF coils may include a plurality of sets of RF coil elements; and each of the plurality of sets of RF coil elements may correspond to one of the plurality of slices of one of the volumes corresponding to the set of RF coil elements, and may be configured to simultaneously excite the plurality of slices of the corresponding volume.

Other features and aspects will be apparent from the following detailed description, the drawings, and the claims.

DETAILED DESCRIPTION

Figure 1A:
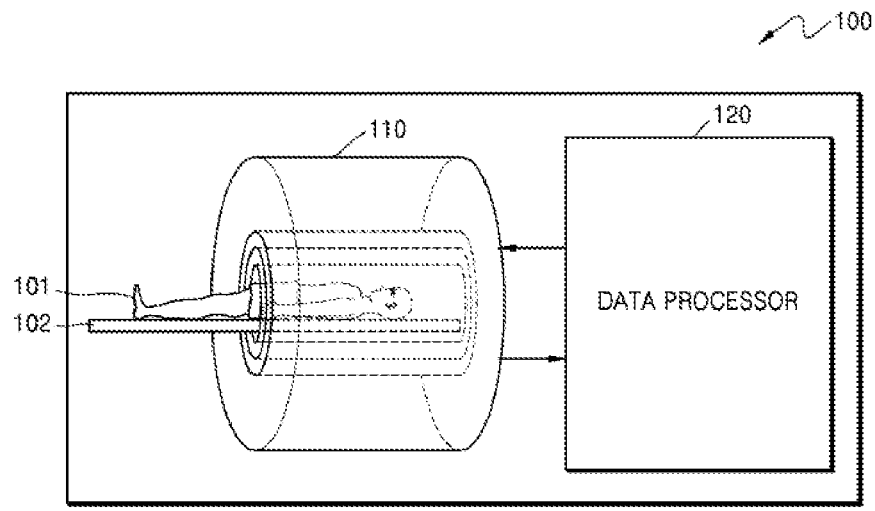
FIG. 1A is a schematic view of an example of a magnetic resonance imaging (MRI) system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness Throughout the drawings and the detailed description, the same reference numerals refer to the same elements. The drawings may not be to scale, and the relative size, proportions, and depiction of elements in the drawings may be exaggerated for clarity, illustration, and convenience.

Figure 1B:
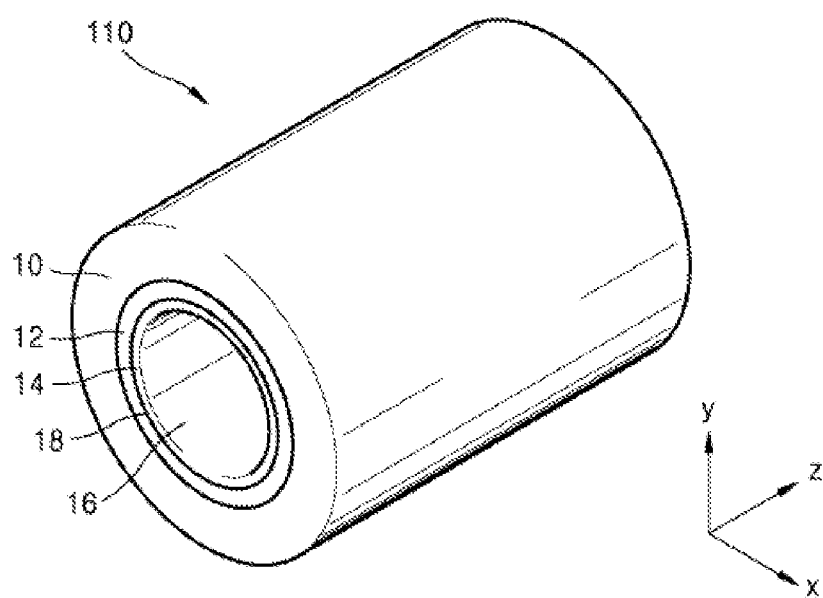
FIG. 1B is a schematic view of an example of an MRI capturing device of the MRI system of FIG. 1A.

FIG. 1A is a schematic view of an example of a magnetic resonance imaging (MRI) system. FIG. 1B is a schematic view of an example of an MRI capturing device of the MRI system of FIG. 1.

Referring to FIGS. 1A and 1B, the MRI system 100 includes an MRI capturing device 110 and a data processor 120 connected to the MRI capturing device 110.

The MRI system 100 noninvasively obtains an image including information about a living tissue of a subject 101. The MRI capturing device 110 typically includes a main magnet 10 having a cylindrical shape, a gradient coil 12 disposed in the main magnet 10, and a radio frequency (RF) coil 14 disposed in the gradient coil 12. Additionally, an RF shield 18 that blocks RF signals from the RF coil 14 may be disposed in the region between the gradient coil 12 and the RF coil 14. However, the gradient coil 12 and the RF coil 14 are not limited to the locations shown in FIG. 1, but may be disposed at any suitable locations.

An empty bore 16 is formed in the RF coil 14. The bore 16 is a space into which the subject 101 lying on a table 102 is moved to perform MRI. Specifically, the subject 101 is placed on the table 102 and is moved in the direction of the z axis in FIG. 1B, that is, in the longitudinal direction of the bore 16. The MRI capturing device 110 may obtain a diagnostic image of the subject when the table 102 is not moving or moving in the bore 16.

To obtain a diagnostic image of a region of interest of the subject 101, the MRI capturing device 110 uses a magnetic field. The region of interest of the subject 101 may be the entire body of the subject 101, the brain, spine, heart, liver, fetus, or any other part of the body of the subject 101.

The main magnet 10 applies a static magnetic field to the subject 101 placed on the table 102 in the bore 16. The gradient coil 12 applies a gradient magnetic field having a predetermined gradient in a predetermined direction while the static magnetic field from the main magnet 10 is applied to the subject 101. The gradient coil 12 may apply a gradient magnetic field having predetermined gradients in two or more directions, such as in directions of the x-, y-, and z-axes in FIG. 1B.

While the static magnetic field from the main magnet 10 and the gradient magnetic field from the gradient coil 12 are applied to the region of interest of the subject 101, the RF coil 14 applies an RF magnetic field via an RF pulse to the subject 101, causing a magnetic resonance signal to be generated from the region of interest of the subject 101. The magnetic resonance signal from the subject 101 is received by a reception coil, which may be the RF coil 14 if the RF coil 14 is a transmission/reception coil, or may be a separate RF reception coil (not shown) of the MRI capturing device 110 if the RF coil 14 is a transmission coil. The received magnetic resonance signal is transmitted from the MRI capturing device 110 to the data processor 120. A diameter of the bore 16 in the MRI capturing device 110 may be determined based on inner diameters of the main magnet 10, the gradient coil 12, and the RF coil 14.

The MRI system 100 may be a hybrid-type MRI system in which the MRI system is combined with another medical imaging system, such as a positron emission tomography (PET) system using radioactive isotopes that emit positrons.

Figure 2A:
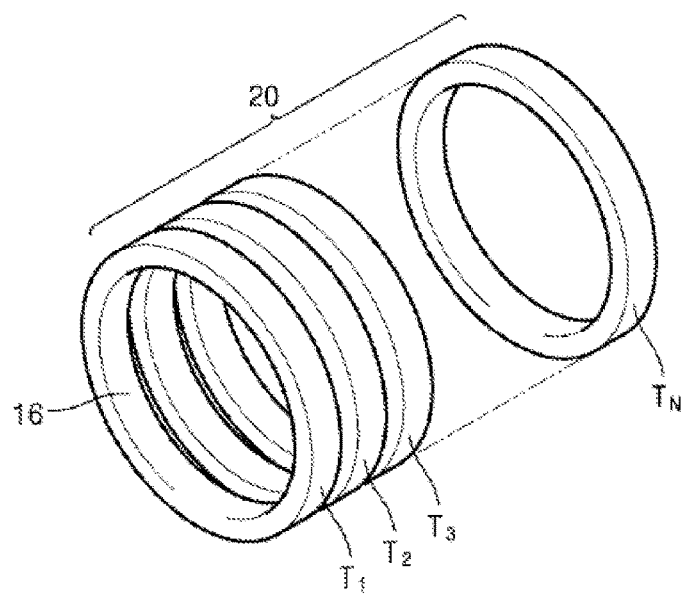
FIG. 2A is a view of an example of a radio frequency (RF) coil that may be used as an RF coil of the MRI system of FIG. 1.
Figure 2B:
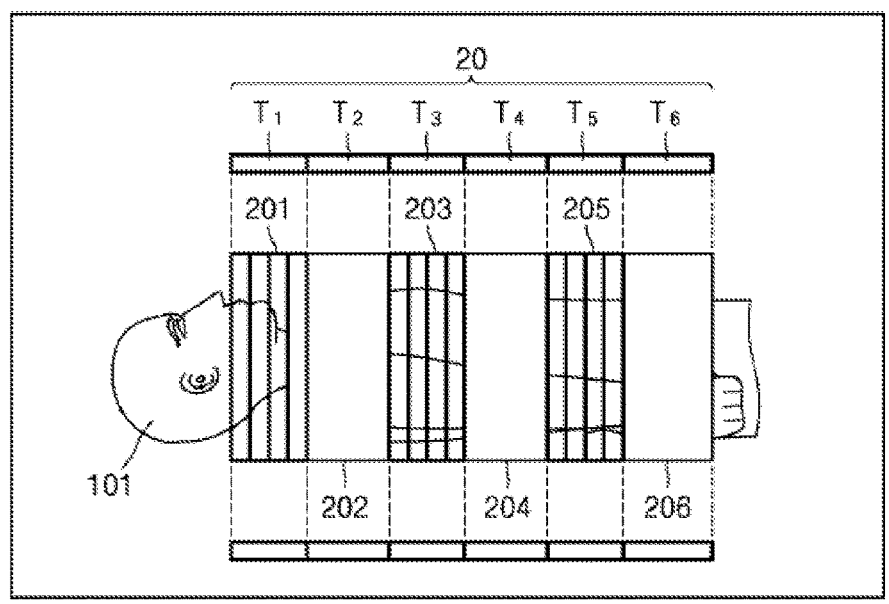
FIG. 2B is a view of an example of a structure of the RF coil of FIG. 2A showing a correspondence between RF coils of the RF coil and volumes representing target regions to be inspected in a subject.

FIG. 2A is a view of an example of an RF coil 20 that may be used as the RF coil 14 of the MRI system 100 of FIG. 1. FIG. 2B is a view of an example of a structure of the RF coil 20 of FIG. 2A showing a correspondence between RF coils of the RF coil 20 and volumes representing target regions to be inspected in the subject 101.

In the example in FIGS. 1A to 2B, the RF coil 20 is formed in the direction of the z-axis as a pTx (parallel transmission) array including a first RF coil T1, a second RF coil T2, a third RF coil T3, . . . , and an Nth RF coil TN arranged in the direction of the z-axis and respectively corresponding to volumes 201 to 206 representing target regions in the subject 101. In the example in FIG. 2B, the Nth RF coil TN is a sixth RF coil T6, and the number N=6 of individual RF coils Tn forming the RF coil 14 is equal to the number of the volumes 201 to 206 representing target regions in the subject 101. However, this is merely an example, and the number N of individual RF coils Tn forming the RF coil 20 may be different from the number of the volumes 201 to 206 representing target regions in the subject 101.

Although six volumes 201 to 206 are shown in FIG. 2B, the subject 101 may be divided into greater or fewer volumes representing target regions. A width of each of the volumes 201 to 206 may range from a sub-millimeter value to a ten of centimeters value, for example from 1 mm to 60 cm.

Each of the RF coils T1 to TN in FIGS. 2A and 2B may apply to the subject 101 RF pulses having a plurality of frequencies to simultaneously excite at least two of the volumes 201 to 206 of the subject 101, 3D-encode each of the excited volumes 201 to 206, and obtain magnetic resonance signals from the volumes 201 to 206 using multi-channel reception coils.

While the static magnetic field is applied to the subject 101, the MRI capturing device 110 may apply to the subject 101 RF pulses having frequencies corresponding to Larmor frequencies of the volumes to simultaneously excite the volumes.

The Larmor frequency will be described below in greater detail. An atomic nucleus has a magnetic moment or a magnetic dipole moment due to a spin motion of the atomic nucleus. If an atom is not under the influence of an external magnetic field, a magnetic moment of the atomic nucleus has a random orientation. However, if the atom is under the influence of an external magnetic field, the atomic nucleus is aligned in the direction of the static magnetic field to have a low energy state. As the atomic nucleus spins, the magnetic moment of the atomic nucleus precesses. A precessional frequency of the magnetic moment of the atomic nucleus is referred to as a Larmor frequency. The Larmor frequency may be determined by multiplying a gyromagnetic ratio of the atomic nucleus by an intensity of the external magnetic field.

Examples of simultaneously exciting the volumes 201 to 206 will be described below. RF pulses applied to the subject 101 may be multi-band RF pulses that are generated by modulating a single volume-selective RF pulse into a plurality of RF pulses. The RF pulses may have different phases, making it possible to perform RF phase encoding.

Each of the RF coils T1 to TN of the MRI system 100 may include a plurality of RF coil elements. Each of the RF coil elements may have a loop shape, a strip shape, or any other suitable shape.

Figure 3:
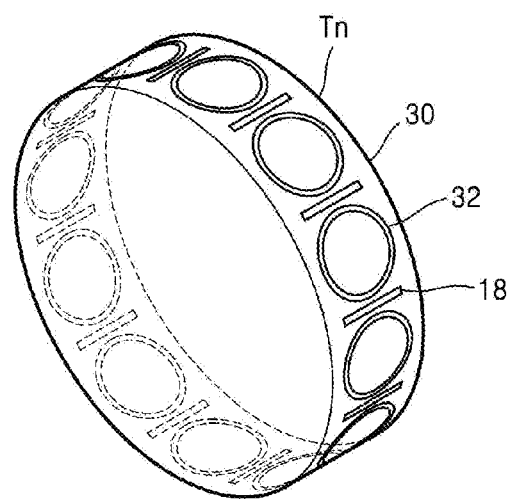
FIG. 3 is view of an example of one of the RF coils of the RF coil of FIG. 2A that includes loop-type RF coil elements.
Figure 4:
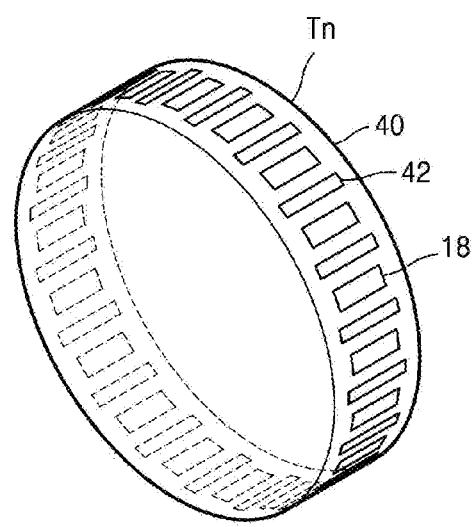
FIG. 4 is a view of an example of one of the RF coils of the RF coil of FIG. 2A that includes strip-type RF coil elements.

FIG. 3 is a view of an example of one of the RF coils Tn of the RF coil 20 of FIG. 2A that includes loop-type RF coil elements. FIG. 4 is a view of an example of one of the RF coils Tn of the RF coil 20 of FIG. 2A that includes strip-type RF coil elements.

Referring to FIGS. 2A to 3, an n-th RF coil Tn, which may be any one of the RF coils T1 to TN of FIG. 2A, may have a structure that includes loop-type RF coil elements 32 disposed on an insulating structure 30. The insulating structure 30 may be made of a material that is light and corrosion-resistant, and has a good moldability. For example, the insulating structure may be made of fiber-reinforced plastic (FRP). Two or more loop-type RF coil elements 32 may be disposed on the insulating structure 30, and each RF coil element 32 may be driven by an independent channel of an RF coil driving circuit. There is no limitation on the number of the loop-type RF coil elements 32 that may be included in one RF coil Tn. For example, eight, twelve, or sixteen loop-type RF coil elements 32 may be included in one RF coil Tn.

As shown in FIG. 2B, each of the volumes 201 to 206 may include a plurality of slices. In the example in FIG. 2B, each of the volumes 201 to 206 includes four slices, but this is only an example, and each of the volumes 201 to 206 may include any number of slices. In one example, if the RF coil Tn of FIG. 3 includes sixteen loop-type RF coil elements 32, the sixteen loop-type RF coil elements 32 of the RF coil Tn may be divided into four sets of loop-type RF coil elements 32 each including four loop-type RF coil elements 32. A first set of four RF coil elements 32 of the RF coil Tn may apply RF fields to a first slice of one of the volumes 201 to 206 corresponding to the RF coil Tn, a second set of four RF coil elements 32 may apply RF fields to a second slice of the corresponding volume, a third set of four RF coil elements 32 may apply RF fields to a third slice of the corresponding volume, and a fourth set of four RF coils 32 may apply RF fields to a fourth slice of the corresponding volume to simultaneously excite the four slices of the corresponding volume. As described above in connection with FIGS. 2A and 2B, each of the RF coils T1 to TN in FIGS. 2A and 2B may apply to the subject 101 RF pulses having a plurality of frequencies to simultaneously excite at least two of the volumes 201 to 206.

Although the loop-type RF coil elements 32 of FIG. 3 are separated from one another in the example in FIG. 3, the RF coil elements 32 may overlap. The loop-type RF coil elements 32 may be disposed at intervals that may be randomly adjusted. An RF shield 18 may be disposed between the RF coil elements 32. An insulating layer made of an insulating material may be disposed on the insulating structure 30 between the loop-type RF coil elements 32.

Referring to FIGS. 2A, 2B, and 4, the n-th RF coil Tn of the RF coil 20, which may be any one of the RF coils T1 to TN of FIG. 2A, may have a structure that includes strip-type RF coil elements 42 disposed on an insulating structure 40. The insulating structure 40 may be made of FRP, for example. Two or more strip-type RF coil elements 42 may be disposed on the insulating structure 40, and each strip-type RF coil element 42 may be driven by an independent channel of an RF coil driving circuit. There is no limitation on the number of the strip-type RF coil elements 32 that may be included in one RF coil Tn. For example, eight, twelve, or sixteen strip-type RF coil elements 32 may be included in one RF coil Tn.

As described above in connection with FIG. 3, each of the volumes 201 to 206 may include a plurality of slices. If the RF coil Tn of FIG. 4 includes a plurality of strip-type RF coil elements 42, the plurality of strip-type RF coil elements 42 of the RF coil Tn may be divided into a plurality of RF coil sets each including a plurality of RF coil elements 42. The number of RF coil sets may be equal to the number of slices in one of the volumes 201 to 206. Each RF coil set of a plurality of RF coil elements 42 may apply RF fields to a corresponding one of the slices of a corresponding one of the volumes 201 to 206 to simultaneously excite the slices of the corresponding volume. As described above in connection with FIGS. 2A and 2B, each of the RF coils T1 to TN in FIGS. 2A and 2B may apply to the subject 101 RF pulses having a plurality of frequencies to simultaneously excite at least two of the volumes 201 to 206.

The strip-type RF coil elements 42 in FIG. 4 may be disposed at intervals that may be randomly adjusted. An RF shield 18 may be disposed between the RF coil elements 42. An insulating layer made of an insulating material may be disposed on the insulating structure 40 between the RF coil elements 42.

The RF coil elements 32 and 42 of FIGS. 3 and 4 may apply RF fields having phases and different frequencies to the subject 101 and receive magnetic resonance signals emitted from the subject 101. The RF coil elements 32 and 42 may apply to the subject RF pulses having different frequencies that simultaneously excite each slice of a corresponding volume of the subject 101. The RF pulses may have the same phase or different phases. If the number of the RF coil elements 32 and 42 and the number N of the RF coils Tn are increased, a resolution of an MRI image that may be obtained from the subject 101 may be increased. The RF coil elements 32 and 42 may include both RF transmission coil elements and RF reception coil elements, or RF transmission/reception coil elements. RF pulses that are applied from RF transmission coils of the RF coil elements 32 and 42 to the subject 101 may include both multi-band RF pulses and spatial encoding RF pulses.

The examples of an MRI system described above may have a plurality of RF coils arranged in the direction of the z-axis, making it possible to enhance a B1+ field uniformity in the direction of the z-axis. In addition, since slices forming volumes of the subject may be simultaneously independently excited, it is possible to minimize interference between regions of the subject and quickly obtain a magnetic resonance signal of the subject.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the detailed description.

What is claimed is:

1. A magnetic resonance imaging (MRI) system comprising:
   a main magnet configured to generate a static magnetic field;
   a gradient coil configured to generate a gradient magnetic field; and
   a radio frequency (RF) coil arrangement comprising RF components corresponding to volumes representing target regions of a subject, each of the volumes comprising slices, each RF component comprising sets of RF coil elements, each set of RF coil elements being configured to apply RF fields to a slice of the corresponding volume, each of the RF components applying RF pulses having different frequencies to excite slices of different volumes simultaneously, and each of the RF coil elements being independently driven by an RF coil driving circuit, wherein a number of the slices is less than a number of the volumes and a number of coil elements in each set equals a number of the sets of the RF coil elements.

2. The MRI system of claim 1, wherein a number of the RF components is less than or equal to a number of the volumes representing the target regions of the subject.

3. The MRI system of claim 1, wherein each of the RF coil elements is a loop-type RF coil element.

4. The MRI system of claim 3, wherein each of the RF components further comprises an insulating substrate on which respective loop-type RF coil elements are disposed.

5. The MRI system of claim 3, wherein each of the RF components further comprises an RF shield disposed between respective loop-type RF coil elements.

6. The MRI system of claim 1, wherein each of the RF coil elements is a strip-type RF coil element.

7. The MRI system of claim 6, wherein each of the RF components further comprises an insulating substrate on which respective strip-type RF coil elements are disposed.

8. The MRI system of claim 6, wherein each of the RF components further comprises an RF shield disposed between respective strip-type RF coil elements.

9. The MRI system of claim 1, wherein the RF coil elements comprise both RF transmission coil elements and RF reception coil elements, or transmission/reception RF coil elements.

10. The MRI system of claim 1, wherein the gradient coil is disposed in the main magnet; and
    the RF coil arrangement is disposed in the gradient coil.

11. The MRI system of claim 1, wherein the RF components are disposed in a direction in which the main magnet is configured to generate the static magnetic field.

12. The MRI system of claim 1, further comprising an RF shield configured to block RF signals from the RF coil, disposed in the region between the gradient coil and the RF coil.

13. The MRI system of claim 1, wherein multiple RF coil elements apply RF fields to a same slice of one of the volumes.

14. A radio-frequency (RF) coil arrangement for a magnetic resonance imaging (MRI) system, comprising:
    an RF coil arrangement comprising RF components, each RF component corresponds to one volume of volumes representing a target region of a subject and the each RF component comprising sets of RF coil elements, each of the volumes comprising slices, each set of RF coil elements corresponding to one slice of the slices of the volume of the corresponding RF component and being configured to excite the one slice, each of the RF components applying RF pulses having different frequencies to excite slices of different volumes simultaneously, and each of the RF coil elements being independently driven by an RF coil driving circuit, wherein a number of the slices is less than a number of the volumes and a number of coil elements in each set equals a number of the sets of the RF coil elements.

15. The RF coil arrangement of claim 14, wherein the RF components are disposed in a direction in which the MRI system is configured to generate a static magnetic field.

16. The RF coil arrangement of claim 14, wherein each of the RF coil elements is a loop-type RF coil element or a strip-type RF coil element.

* * * * *